(12) United States Patent
Callahan et al.

(10) Patent No.: US 7,397,049 B2
(45) Date of Patent: Jul. 8, 2008

(54) DETERMINING ION BEAM PARALLELISM USING REFRACTION METHOD

(75) Inventors: Raymond Callahan, Gloucester, MA (US); David Olson, Gloucester, MA (US); Wilhelm P. Platow, Somerville, MA (US); Stanislav S. Todorov, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 336 days.

(21) Appl. No.: 11/386,596

(22) Filed: Mar. 22, 2006

(65) Prior Publication Data

US 2007/0221871 A1 Sep. 27, 2007

(51) Int. Cl.
*G01N 23/00* (2006.01)
*G21K 5/10* (2006.01)

(52) U.S. Cl. .............................. 250/492.21; 250/491.1; 250/492.1; 250/492.2; 250/492.3; 313/359.1

(58) Field of Classification Search ............. 250/491.1, 250/492.1, 492.2, 492.21, 492.11, 492.23, 250/492.3, 442.11, 398, 396 R, 396 ML, 250/423 R, 424; 313/360.1, 359.1; 324/71.3
See application file for complete search history.

(56) References Cited

U.S. PATENT DOCUMENTS 5,696,382 A * 12/1997 Kwon ................... 250/492.21

| | | | |
|---|---|---|---|
| 6,437,350 B1 * | 8/2002 | Olson et al. ............ 250/492.21 |
| 6,690,022 B2 | 2/2004 | Larsen et al. |
| 6,791,094 B1 * | 9/2004 | Olson et al. ................. 250/397 |
| 6,828,572 B2 | 12/2004 | Reece et al. |
| 6,858,854 B2 | 2/2005 | Keum et al. |
| 6,903,350 B1 * | 6/2005 | Vanderberg et al. ..... 250/492.21 |
| 2003/0183780 A1 | 10/2003 | Makoto et al. |
| 2006/0169922 A1 * | 8/2006 | Chang et al. ............ 250/492.21 |
| 2007/0221871 A1 * | 9/2007 | Callahan et al. ........ 250/492.21 |

FOREIGN PATENT DOCUMENTS

| | | | |
|---|---|---|---|
| EP | 0457321 A2 | 11/1991 |
| EP | 1202320 A | 5/2002 |
| JP | 01082443 A | 3/1989 |

* cited by examiner

*Primary Examiner*—Bernard E Souw (57) ABSTRACT

A system, method and program product for determining parallelism of an ion beam using a refraction method, are disclosed. One embodiment includes determining a first test position of the ion beam while not exposing the ion beam to an acceleration/deceleration electrical field, determining a second test position of the ion beam while exposing the ion beam to an acceleration/deceleration electrical field, and determining the parallelism of the ion beam based on the first test position and the second test position. The acceleration/deceleration electrical field acts to refract the ion beam between the two positions when the beam is not parallel, hence magnifying any non-parallelism. The amount of refraction, or lateral shift, can be used to determine the amount of non-parallelism of the ion beam. An ion implanter system and adjustments of the ion implanter system based on the parallelism determination are also disclosed.

24 Claims, 7 Drawing Sheets

DETERMINING ION BEAM PARALLELISM USING REFRACTION METHOD

BACKGROUND OF THE INVENTION

1. Technical Field

The present invention relates generally to ion implantation, and more particularly, to a system, method and program product for determining parallelism of an ion beam using a refraction method.

2. Related Art

Controlling the angle or parallelism of an ion beam is important for the proper operation of various different types of devices and processes. Ion implantation is a standard technique for introducing conductivity-altering impurities into, or doping, semiconductor wafers. A typical ion implantation process uses an energetic ion beam to introduce impurities into work pieces, i.e., semiconductor wafers. As is well known, introducing the impurities at a uniform depth and dose into the work pieces is important to ensure that semiconductor devices being formed to operate properly.

Figure 1:
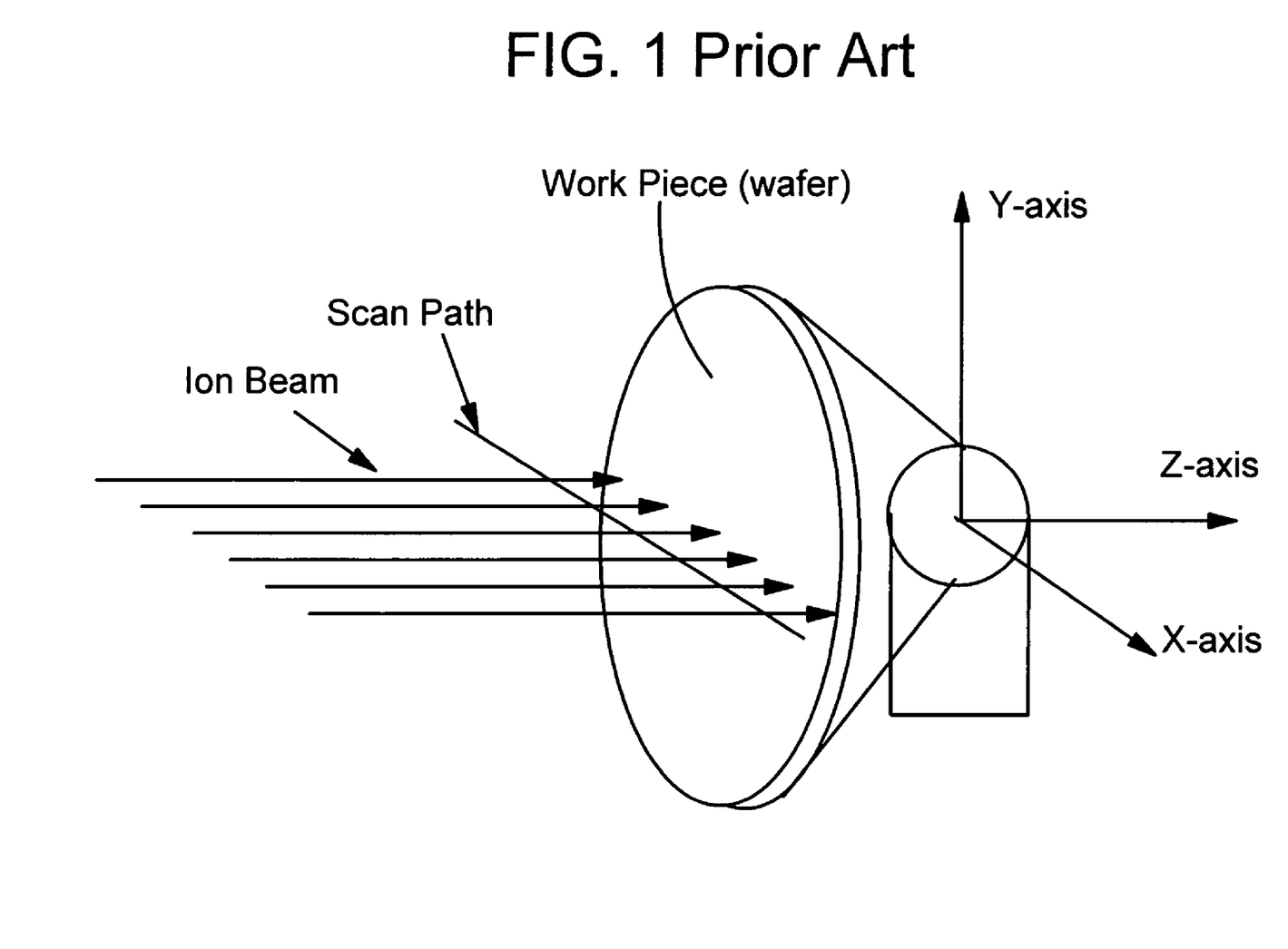
FIG. 1 shows a three-dimensional view of the definitions used in a conventional ion beam implantation geometry.

FIG. 1 shows schematically, in three dimensions, a conventional implantation of an ion beam into a wafer. Z-Axis and X-Axis constitute a horizontal ion beam scan plane. An ion beam is delivered (desirably) parallel to the Z-Axis and strikes the planar surface of the wafer. The X-Axis is horizontally perpendicular to the Z-Axis. The ion beam is scanned back and forth along a scan path parallel to the X-Axis. The Y-Axis is vertically perpendicular to the ion beam scan plane (i.e., the XZ-coordinate plane). The wafer is scanned up and down along another scan path parallel to the Y-Axis by moving the wafer up and down.

The depth at which impurities are implanted depends in part upon the angle of incidence of the ion beam along a desired direction, typically perpendicular, to the crystal structure of the semiconductor. Therefore, it is important to control the angle of the ion beam during implantation to maintain a desired direction of the ion trajectories relative to a wafer's crystal structure, particularly when scanning the ion beam across a wafer surface. In particular, in order to achieve repeatable implant results, the angle of the ion beam should be known and controlled to a range of error of less than 1° from parallel to the desired direction, especially for high energy implants and channeled implants. Conventional methods of determining ion beam parallelism are very complex and do not achieve the accuracy of angle determination described above. In addition, conventional methods of correcting ion beam parallelism are incapable of achieving the above-described range of error.

There is a need for an improved method of determining parallelism of an ion beam and/or adjusting the ion implanter system based on the parallelism determination.

SUMMARY OF THE INVENTION

A system, method and program product for determining parallelism of an ion beam using a refraction method, are disclosed. One embodiment includes determining a first test position of the ion beam while not exposing the ion beam to an acceleration/deceleration electrical field, determining a second test position of the ion beam while exposing the ion beam to an acceleration/deceleration electrical field, and determining the parallelism of the ion beam based on the first test position and the second test position. The acceleration/deceleration electrical field acts to refract the ion beam between the two positions when the beam is not parallel, hence magnifying any non-parallelism. The amount of refraction, or lateral shift, can be used to determine the amount of non-parallelism of the ion beam. An ion implanter system and adjustments of the ion implanter system based on the parallelism determination are also disclosed.

A first aspect of the invention is directed to a method for determining parallelism of an ion beam in an ion implanter system for implanting into a work piece, the method comprising the steps of: determining a first test position of the ion beam while not exposing the ion beam to an acceleration/deceleration electrical field; determining a second test position of the ion beam while exposing the ion beam to the acceleration/deceleration electrical field; and determining the parallelism of the ion beam based on the first test position and the second test position.

A second aspect of the invention is directed to a system for determining a parallelism of an ion beam in an ion implanter system for implanting into a work piece, the method comprising the steps of: a position determinator for determining a first test position of the ion beam while not exposing the ion beam to an acceleration/deceleration electrical field and a second test position of the ion beam while exposing the ion beam to the acceleration/deceleration electrical field; and a parallelism determinator for determining the parallelism of the ion beam based on the first test position and the second test position.

A third aspect of the invention is directed to a computer program product for determining a parallelism of an ion beam in an ion implanter system for implanting into a work piece, the computer program product comprising: a computer usable medium having computer usable program code embodied therein, the computer usable medium including: program code configured to determine a first test position of the ion beam while not exposing the ion beam to an acceleration/deceleration electrical field; program code configured to determine a second test position of the ion beam while exposing the ion beam to the acceleration/deceleration electrical field; and program code configured to determine the parallelism of the ion beam based on the first test position and the second test position.

A fourth aspect of the invention is directed to an ion implanter system for implanting an ion beam into a work piece, the ion implanter system comprising: an ion beam generator; and a system for determining a parallelism of the ion beam in the ion implanter system including: a position determinator for determining a first test position of the ion beam while not exposing the ion beam to an acceleration/deceleration electrical field and determining a second test position of the ion beam while exposing the ion beam to the acceleration/deceleration electrical field; and a parallelism determinator for determining the parallelism of the ion beam based on the first test position and the second test position.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

1. Definitions

In the above and following disclosure, the listed words (phrases) are defined as follows:

"Parallelism" is the amount of divergence between an ion beam or an ion trajectory and a desired direction of the ion beam, which is typically parallel to a Z-Axis in an ion beam scan plane. "Angle of incidence" (or simply angle) is the direction by which the ion beam impinges on the wafer surface. The wafer surface may or may not lie in the YZ plane.

An "ion beam scan plane" is a horizontal XZ-coordinate plane in which an ion beam is delivered parallel to the Z-Axis and scanned back and forth along a scan path parallel to the X-Axis.

A "scan path" is a range along an X-Axis within which an ion beam is scanned. A "scan position" is a lateral position along the scan path.

A "test position" of an ion beam is a set lateral position along an X-Axis along the scan path at which parallelism is tested, i.e., a particular scan position. The ion beam may be exposed or not exposed to an acceleration/deceleration electrical field at a test position, as will be described below.

2. Ion Implanter System Overview

Figure 2:
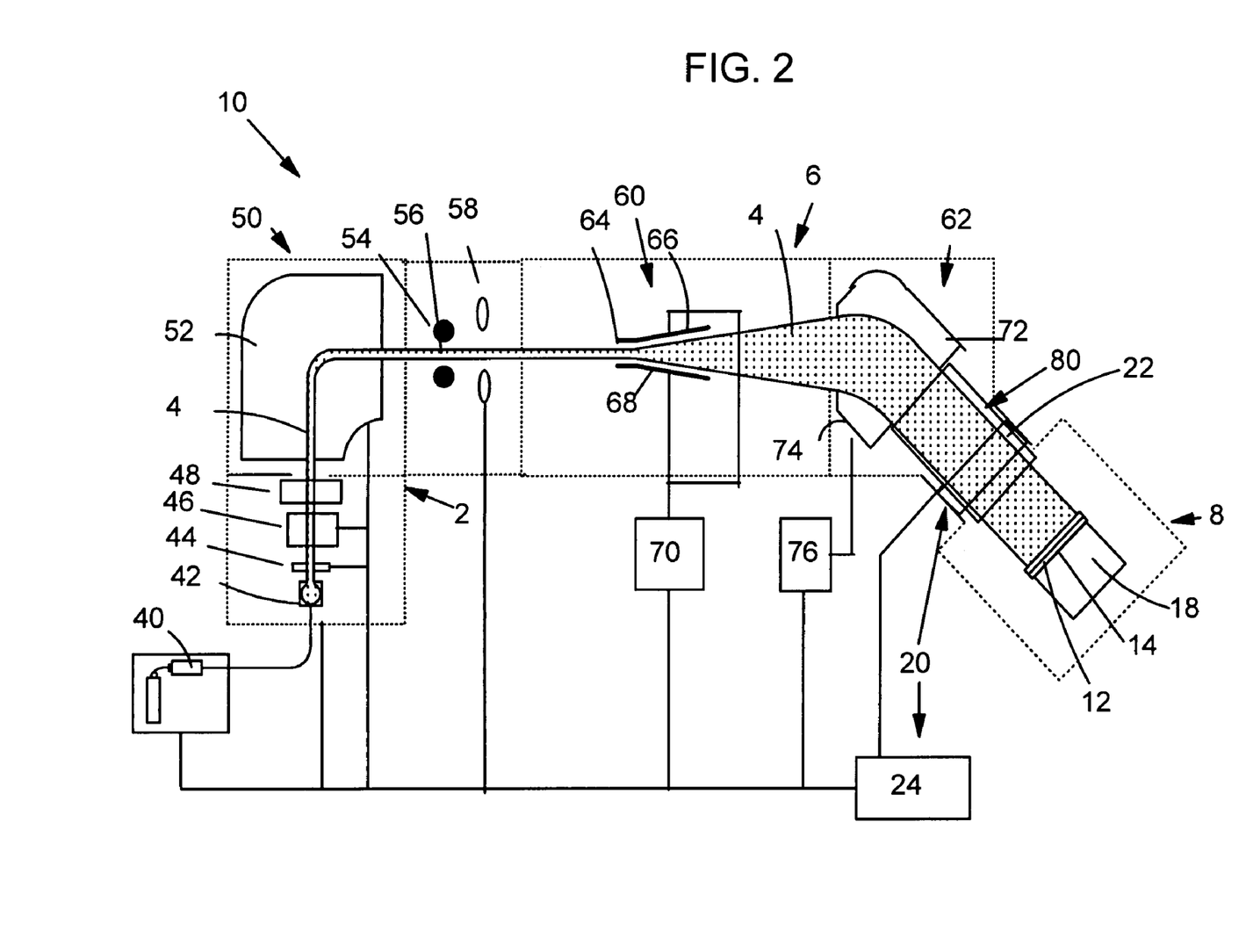
FIG. 2 shows a schematic view of an ion beam implanter system according to one embodiment of the invention.

With reference to the accompanying drawings, FIG. 2 shows an illustrative ion implanter system 10, which may be used in the present invention. Implanter system 10 includes an ion beam generator sub-system 2 for generating and transmitting an ion beam 4, through ion beam scanning sub-system 6, to a work piece sub-system 8. Ion beam generator sub-system 2 may include any now known or later developed ion beam generator such as those available from Varian Semiconductor Equipment Associates. Typically, work piece sub-system 8 includes one or more semiconductor work pieces 12 (e.g., wafer) mounted to a platen 14. Characteristics and positioning of platen 14 and, hence, work piece 12, may be controlled by a platen drive assembly 18 that rotates work piece 12, i.e., wafer, relative to ion beam 4, and/or controls a vertical scan position of work piece 12. Ion implanter system 10 may include additional components known to those skilled in the art. For example, work piece sub-system 8 typically includes automated work piece handling equipment for introducing work pieces into ion implanter system 10 and for removing work pieces after implantation, a dose measurement device, an electron flood gun, etc. It is understood that the entire path traversed by ion beam 4 is evacuated during ion implantation.

Besides the above-described components, ion beam generator sub-system 2 may include a gas flow delivery 40, an ion beam source 42, an extraction manipulator 44, a filter magnet 46, a first acceleration/deceleration column 48, and a mass analyzer 50. Filter magnet 46 is preferably positioned in close proximity to ion beam source 42, and precedes first acceleration/deceleration column 48. Extraction manipulator 44 is positioned between filter magnet 46 and ion beam source 42. Mass analyzer 50 may include, for example, a dipole analyzing magnet 52, a mass slit 54 having a resolving aperture 56, and an electrostatic lens 58.

Scanning sub-system 6 may include, for example, a scanner 60, an angle corrector 62 and a second acceleration/deceleration column 80. Scanner 60, which may be an electrostatic scanner, deflects ion beam 4 to produce a scanned ion beam 4 having ion trajectories which diverge from a scan origin 64. Scanner 60 may include spaced-apart scan plates 66 and 68 responsive to a scan generator 70. Scan generator 70 generates a scan voltage waveform, such as a sawtooth, or triangular waveform, for deflecting ion beam 4 in accordance with the electric field between scan plates 66 and 68. Angle corrector 62 is designed to deflect ions in scanned ion beam 4 to have parallel ion trajectories, i.e., to focus scanned ion beam 4. In one embodiment, angle corrector 62 may include magnetic pole pieces 72 that are spaced apart to define a gap, and a magnetic coil 74 that is coupled to a power supply 76. Scanned ion beam 4 passes through the gap between pole pieces 72 and is deflected in accordance with a magnetic field in the gap. The magnetic field may be adjusted by varying the current through magnetic coil 74 which is provided by power supply 76. A second acceleration/deceleration column 80 is positioned between angle corrector 62 and work piece sub-system 8, and is capable of applying an electrical field to accelerate ion beam 4 or decelerate ion beam 4. In one embodiment, it is within this acceleration/deceleration column 80 that the teachings of the current invention are applied.

Ion implanter system 10 may further include an ion implant/ion beam control system 20. Control system 20 includes at least one ion beam profiler 22 and a controller 24. In one embodiment, profiler 22 is positioned after the acceleration/deceleration column 80, ideally at the wafer plane. Profiler 22 is coupled to controller 24 to receive measurement parameters from and communicate measurement results to controller 24. Controller 24 is further coupled to ion beam generator sub-system 2 and ion beam scanning sub-system 6 to set up/adjust system parameters. Specifically, controller 24 is coupled to, inter alia, extraction manipulator 44, filter magnet 46, mass analyzer 50, electrostatic lens 58, scan generator 70, power supply 76, second acceleration/deceleration column 80, etc. Additional features of control system 20 including profiler 22 and controller 24 will be further described in detail below.

Figure 3:
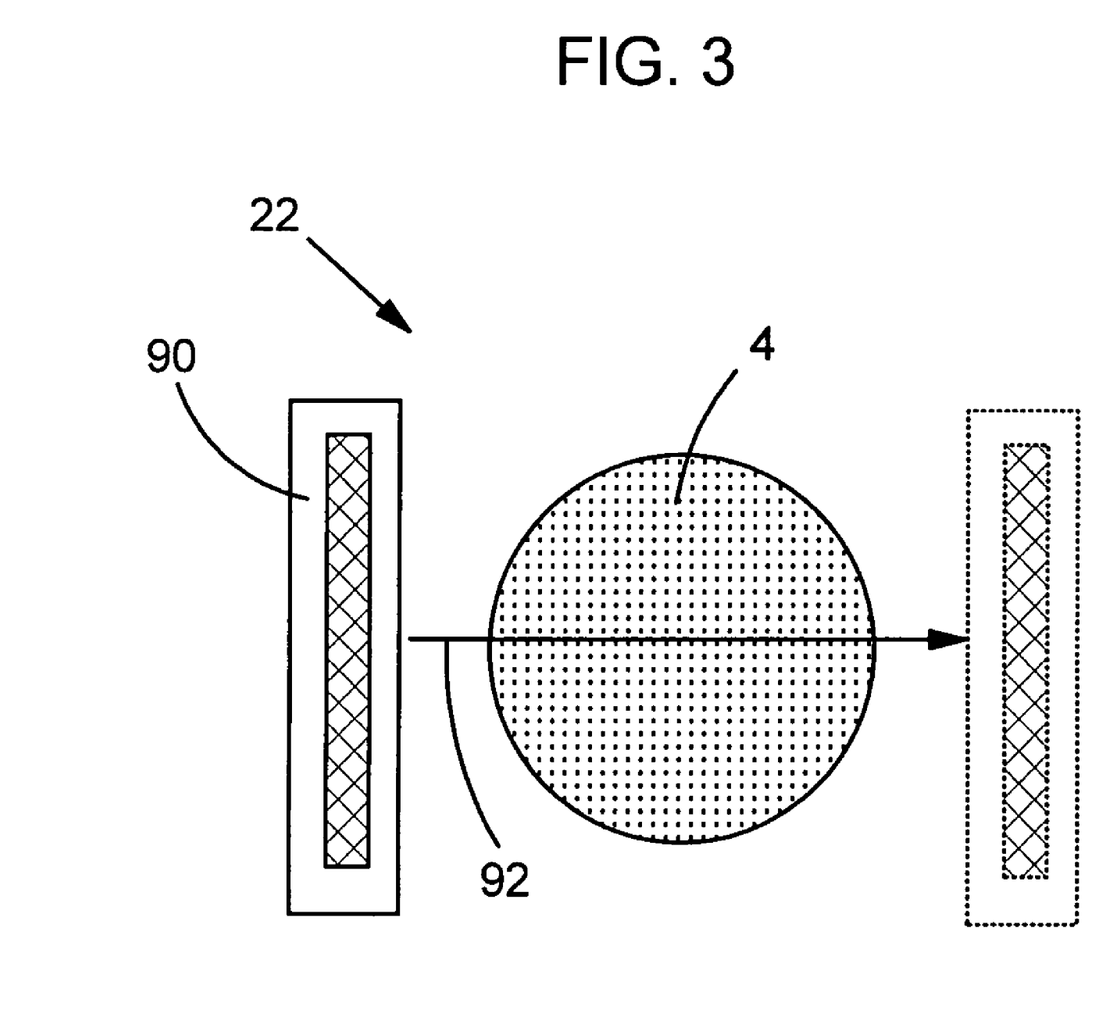
FIG. 3 shows a schematic view of a profiler of the ion beam implanter system of FIG. 2 according to one embodiment of the invention.

Referring to FIG. 2 and 3, in one embodiment, profiler 22 includes a traveling faraday cup system 90. Faraday cup system 90 is positioned in a lateral traveling line 92 substantially parallel to the X-Axis (FIG. 1). That is, traveling line 92 is substantially parallel to the scan path (FIG. 1) of ion beam 4. A desired direction of ion beam 4 is parallel to the Z-Axis. Traveling line 92 is located ideally at the work piece plane. Although an illustrative schematic embodiment of profiler 22 has been illustrated above, it should be understood by those skilled in the art that any now known or later developed system or method to measure an ion beam profile may be used in the current invention and is within the scope of the current invention. For example, although the above described embodiment includes a single faraday cup system 90, more than one (n≧1) faraday cup can be used in a profiler of the current invention. Moreover, although the above described embodiment includes a traveling faraday cup system 90, multiple (n≧1) stationary faraday cups can be positioned along traveling line 92 (or parallel to traveling line 92) to replace traveling faraday cup system 90.

Figure 4:
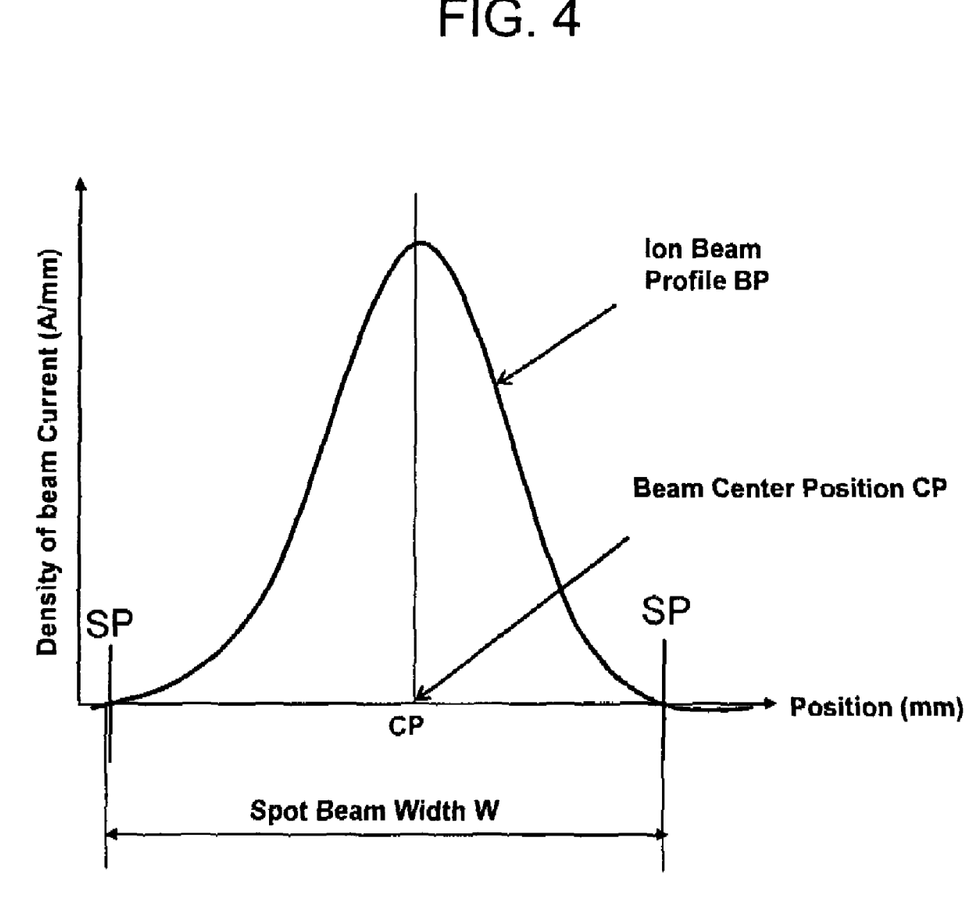
FIG. 4 shows an illustrative ion beam profile obtained by the profiler of FIG. 3.

FIG. 4 shows an illustrative profile of a spot ion beam 4 (FIG. 2). In FIG. 4, a density of ion beam current (A/mm) is shown as a function of a lateral position along X-Axis (FIG.

1). It should be recognized that density is measured in units of length, rather than area, because the measurement is made across a width interval of ion beam 4. As stated above, a lateral position of an ion beam is set along an X-Axis along the scan path at which parallelism is tested. In one embodiment, the test position is defined by the ion beam center position (CP) that corresponds to the horizontal geometry center of the area under the ion beam profile. Ion trajectories represented by the density of ion beam current corresponding to the center position strike a work piece in approximately the local ion beam angle mean of the ion beam 4. An ion beam width (W) indicates a space between two positions that correspond to zero density of ion beam current, which corresponds to the local ion beam angle spread. Alternatively, the position can be defined by either ion beam side position (SP), i.e., where zero density of ion beam current is observed, so long as the position determinations, described below, consistently use the same side position (SP).

Although an exemplary ion implanter system 10 (FIG. 2) has been illustrated above, it should be understood by those skilled in the art that any now known or later developed system to generate and scan ion beam 4 (FIG. 2) may be used for the current invention. It is well known in the art how an ion beam 4 is generated by generator sub-system 2 (FIG. 2) and is scanned by scan sub-system 6 (FIG. 2). Therefore, description of those processes is not necessary for the understanding of the current invention. However, it should be understood that the current invention can be used with any now known or later developed process and methods of ion implantation.

3. Controller Overview

Figure 5:
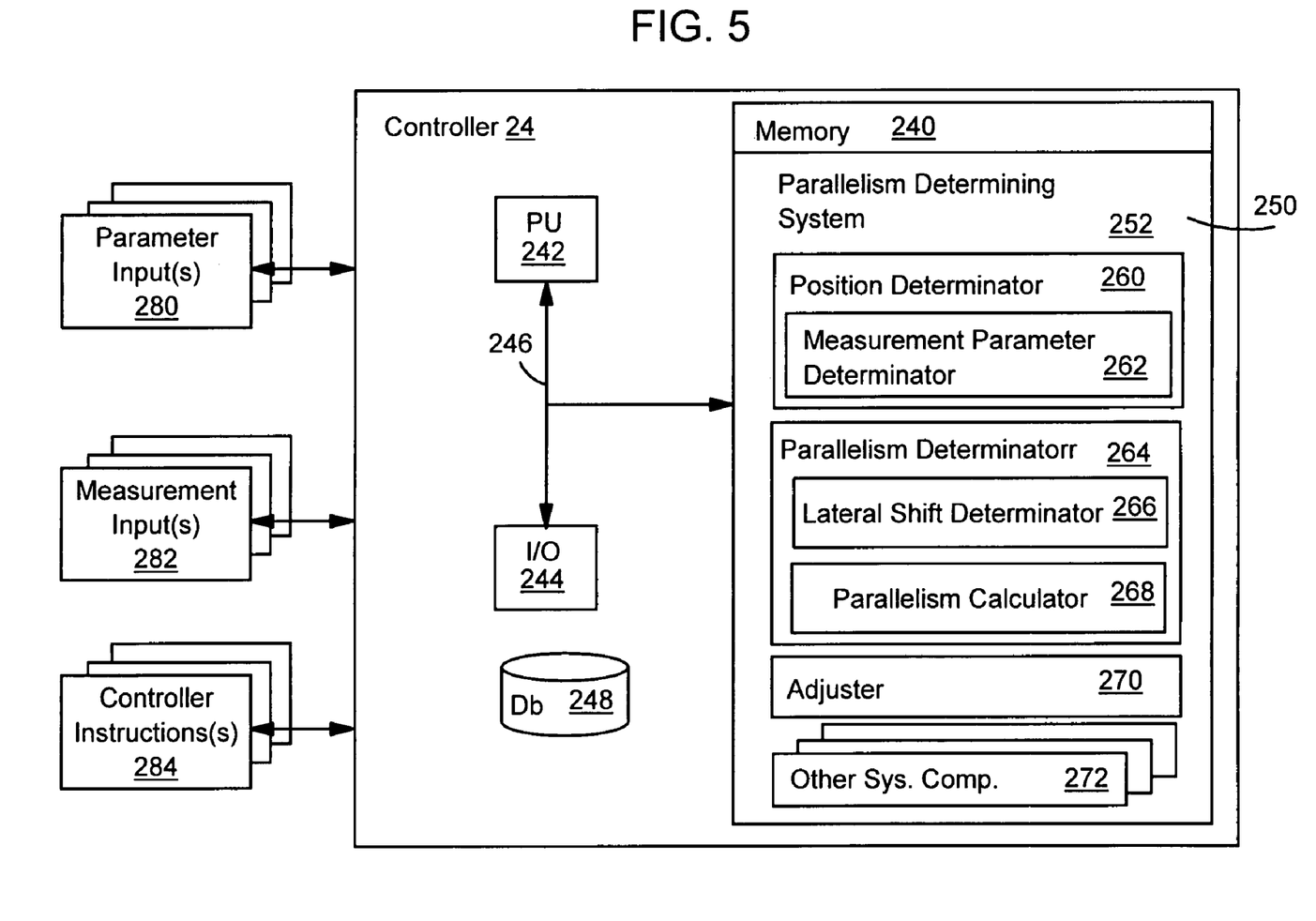
FIG. 5 shows a block diagram of a parallelism determining system according to one embodiment of the invention.

Referring to FIG. 5 in conjunction with FIG. 2, a block diagram of an illustrative controller 24 is shown. Controller 24 includes a computer control system responsive to, inter alia, ion beam generator sub-system 2, ion beam scanning sub-system 6, work piece sub-system 8 and profiler 22. In one embodiment, controller 24 includes a memory 240, a processing unit (PU) 242, input/output devices (I/O) 244 and a bus 246. A database 248 may also be provided for storage of data relative to processing tasks. In one embodiment, memory 240 includes a program product 250 that, when executed by PU 242, comprises various functional capabilities described in further detail below. Memory 240 (and database 248) may comprise any known type of data storage system and/or transmission media, including magnetic media, optical media, random access memory (RAM), read only memory (ROM), a data object, etc. Moreover, memory 240 (and database 248) may reside at a single physical location comprising one or more types of data storage, or be distributed across a plurality of physical systems. PU 242 may likewise comprise a single processing unit, or a plurality of processing units distributed across one or more locations. I/O 244 may comprise any known type of input/output device including a network system, modem, keyboard, mouse, scanner, voice recognition system, CRT, printer, disc drives, etc. Additional components, such as cache memory, communication systems, system software, etc., may also be incorporated into controller 24.

As shown in FIG. 5, program product 250 may include a parallelism determining system 252 that includes a position determinator 260 including a measurement parameter determinator 262, a parallelism determinator 264 including a lateral shift determinator 266 and a parallelism calculator 268, an adjuster 270 and other system components 272. Other system components 272 may include any now known or later developed parts of an ion implantation controller not individually delineated herein, but understood by those skilled in the art.

Referring to both FIGS. 2 and 5, inputs to controller 24 include parameter inputs 280 and measurement inputs 282. Parameter inputs 280 include those from a wide variety of ion implanter system 10 components including, for example, ion generator sub-system 2, ion beam scanning sub-system 6, profiler 22, acceleration/deceleration column 80, and user entered or other parameter inputs. Parameter inputs 280 may indicate, among other things, particular states of ion implanter system 10 including profiler 22 and/or particular components thereof or may indicate user defined input parameters. That is, a parameter input 280 may be any characteristic of ion implanter system 10 including profiler 22, user defined constants or other variables that may affect operation of the system 10 including, in particular to the present invention, parallelism and direction of ion beam 4. Based on the above-described components of profiler 22 (FIGS. 2-3) used to measure a profile of ion beam 4, parameter inputs 280 may include, for example, a desired direction of ion beam 4, positions of sampling faraday cup system 90 including lateral line 92, width of the faraday cup openings, etc. Furthermore, based on the above-described components of ion implanter system 10, parameter inputs 280 may include, for example, filter magnet 46 voltage, source dopant gas 40 flow rate, extraction manipulator 44 positioning (e.g., X, Y, Z axis), mass slit 54 aperture 56 opening, scan plates 66 and 68 spacing, scan generator 70 output (voltage, waveform, direct/alternative, etc), magnetic pole pieces 72 spacing, power supply 76 output, work piece vertical scan system position 18 control setting and/or horizontal (XZ-coordinate plane) ion beam scan speed.

Measurement inputs 282 include the results of a measurement by profiler 22.

Controller instructions 284 include the instructions to adjust system parameters similar as those received as parameter inputs 280. For example, controller instructions 284 may include instructions to adjust an angle of work piece 12 or an optical component, e.g., corrector magnet 62, electrostatic lens 58, etc., of ion implanter system 10. It should be recognized that the above-described list is meant to be illustrative only. For example, it is common for a conventional controller to receive more than 5000 parameter inputs and create as many controller instructions, depending on the makeup of the ion implanter system used.

4. Parallelism Determineng System

Parallelism determining system 252 functions generally to determine parallelism of ion beam 4, i.e., any angle divergence from parallel, using a refraction method. In one embodiment, as mentioned above, the teachings of the invention are applied within second acceleration/deceleration column 80, which is positioned just upstream from work piece sub-system 8. However, it should be recognized that the acceleration/deceleration electrical field may be applied at a different test area within ion implanter system 10. One embodiment of operation of parallelism determining system 252 is shown in the flow diagram of FIG. 6. The illustrative embodiment of operation will be described with reference to FIGS. 2 and 5-7.

Figure 6:
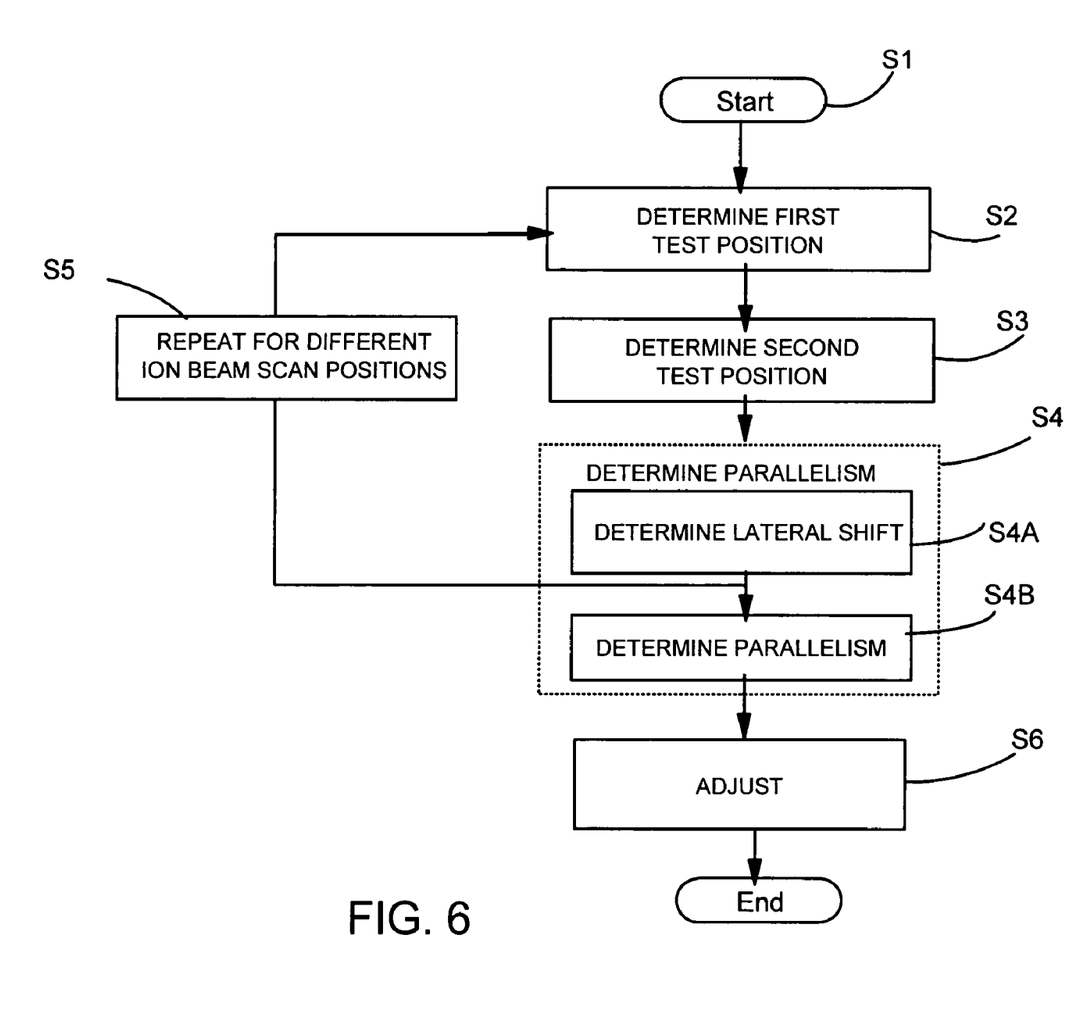
FIG. 6 shows a flow diagram of one embodiment of operation of the parallelism determining system of FIG. 5.

In step S1, the process starts with controller 24 setting up system parameters of ion beam implanter system 10 in any conventional manner, including, for example, setting up ion beam generator sub-system 2 and scanning sub-system 6 to generate, transmit and scan an ion beam 4 according to the requirements with respect to a specific work piece 12, including a desired direction of ion beam 4. The actual ion beam 4 generated and scanned, however, may not be parallel and may be divergent from a desired direction as it enters work piece sub-system 8.

Next, in step S2, position determinator 260 determines a first test position of ion beam 4 while not exposing the ion beam to an acceleration/deceleration electrical field. That is, a first test position of ion beam 4 is determined by position determinator 260 using measurement parameter determinator 262 obtaining a profile and position of ion beam 4 at a first test position, i.e., using profiler 22, while no electrical field is applied by acceleration/deceleration column 80. As illustrated, profiler 22 is after the second acceleration/deceleration column 80. The first test position represents the position of ion beam without being accelerated or decelerated by the acceleration/deceleration electrical field of second acceleration/deceleration column 80. In step S3, position determinator 260 determines a second test position of ion beam 4 while exposing ion beam 4 to an acceleration/deceleration electrical field. That is, a second test position of ion beam 4 is determined by position determinator 260 using measurement parameter determinator 262 obtaining a profile and position of ion beam 4 at a second test position, i.e., using profiler 22, while an electrical field to either accelerate or decelerate ion beam 4 is applied by second acceleration/deceleration column 80. The second test position represents the position of ion beam 4 refracted by the electrical field. Any divergent angle from parallel exhibited by ion beam 4 is therefore magnified by the electrical field.

Figure 7:
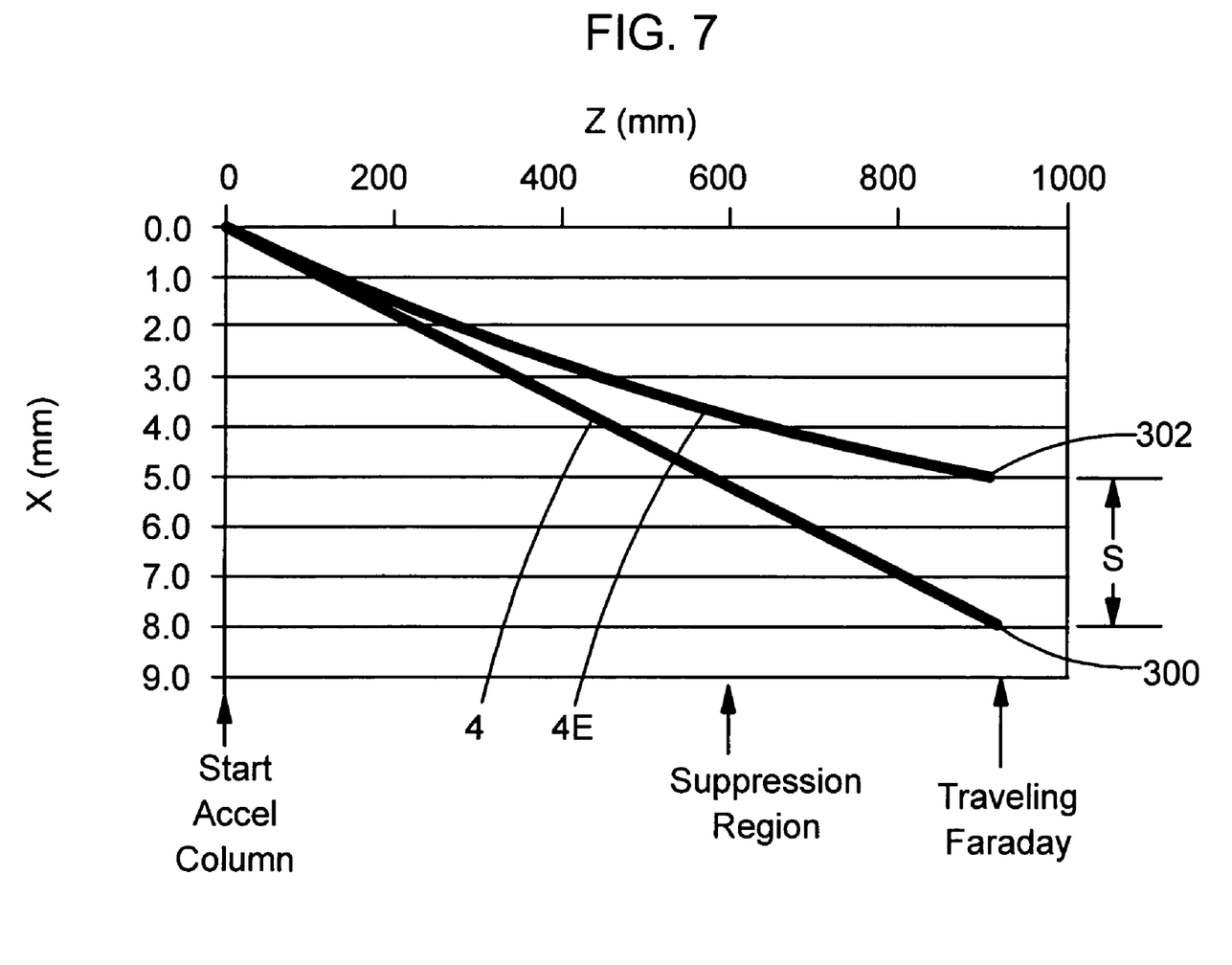
FIG. 7 shows a two-dimensional graph of an ion beam position determination according to one embodiment of the invention.

Referring to FIG. 7, a two-dimensional graph showing a calculation of the beam path for first test position 300 (no electrical field) of an ion beam 4 and second test position 302 (with electrical field) of an ion beam 4E is shown. Each test position 300, 302 was calculated for a particular scan position of ion beam 4. In the graph, the horizontal axis represents an actual Z-axis, which extends the longitudinal length of a test area within second acceleration/deceleration column 80, and the vertical axis represents an actual X-axis, which extends laterally across the test area. In this example, the following parameters were used: an extraction voltage for ion beam 4 (energy entering acceleration/deceleration column 80) was approximately 70 kV, an acceleration voltage of approximately 190 kV, a charge state of n=1 and an atomic mass unit (AMU) of approximately 40. As illustrated in the graph, first test position 300 of ion beam 4 is at approximately 8 mm along the X-axis across work piece 12, and second test position 302 of ion beam 4E is at approximately 5 mm along the X-axis across work piece 12. That is, ion beam 4E is laterally shifted (or refracted) (along the X-axis) by the acceleration electrical field by approximately 3 mm. This lateral shift (S) indicates ion beam 4 is divergent from parallel when it enters acceleration/deceleration column 80, and hence would be angled when it encounters work piece 12. If ion beam 4 were not divergent (i.e., substantially parallel) when it enters acceleration/deceleration column 80, the first and second test position 300, 302 would be substantially the same and there would be little or no lateral shift. As also shown in FIG. 7, faraday cup system 90 is positioned at approximately 900 mm from a starting end of acceleration/deceleration column 80. However, faraday cup system 90 may be positioned at any location sufficiently separated from the acceleration/deceleration column 80 to observe the refraction of an ion beam under the influence of the electrical field.

Returning to FIGS. 5 and 6, in step S4, parallelism determinator 264 determines a parallelism of ion beam 4 based on first test position 300 and second test position 302. In one embodiment, step S4 includes a number of sub-steps. In sub-step S4A, lateral shift determinator 266 determines a lateral shift (S) between first test position 300 and second test position 302. That is, lateral shift determinator 266 determines the lateral distance between first test position 300 and second test position 302. Next, in sub-step S4B, parallelism calculator 268 determines the parallelism of ion beam based on lateral shift (S). This sub-step S4B can be implemented in a number of ways.

In one embodiment, parallelism is calculated based on calibrated empirical data. For example, in one illustrative test, empirical data is used to calculate parallelism for one illustrative species, argon ($Ar^+$), and extraction voltage (energy at entrance to test area), 60 kV. Measurements were made with no acceleration/deceleration electrical field, i.e., 0 kV accel, applied at three test positions: left, center and right. The left test position had a scanner voltage of 5.7 kV and a position of 55 mm, the center test position had a scanner voltage of 11.5 kV and a position of 155 mm, and the right test position had a scanner voltage of 17.2 kV and a position of 255 mm. A corrector magnet current (K lens) for all test positions was 73.8 A, and a target current ranged from 47-66 µA. Measurements were also made with exposure to acceleration electrical field of 100 kV at the corresponding test positions: left, center and right, respectively. Results indicated a lateral shift for the left and center test positions of −1 mm lateral shift, which indicates the ion beam is not parallel. Similar data can be obtained using a deceleration electrical field of, for example, −30 kV. Based on the above data, a calibration algorithm can be implemented indicating parallelism or an angle of an ion beam. The data described above, for example, indicates an angle of 0.2°.

Step S5 represents an optional step in which the first and second test position determining step (S4A) is repeated for a plurality of scan positions of ion beam 4. For example, three scan positions may be used as test positions: left, center and right. In other words, ion beam 4 is moved to various scan positions at which it is expected to be used and faraday cup system 90 is used to determine the first and second test position for each scan position. In this case, the parallelism determining step (S4B) includes determining parallelism based on each of the first and second test positions.

In another optional step S6, adjuster 270 adjusts ion implanter system 10 based on a result of the parallelism determining step S4. In one embodiment, this step includes adjusting at least one of the following: an angle of the work piece and an optical component of ion implanter system 10. The angle of work piece 12 can be adjusted using platen drive assembly 18 to accommodate the parallelism of ion beam 4. The optical component may include any part of ion implanter system 10 capable of adjusting an angle of ion beam 4, e.g., corrector magnet 42, scanner 60, electrostatic lens 58, etc.

5. Conclusion

In the previous discussion, it is understood that the method steps discussed may be performed by a processor, such as PU 242 of controller 24, executing instructions of program product 250 stored in a memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While shown and described herein as a method, system and computer product for determining ion beam parallelism and direction integrity, it is understood that the invention further provides various alternative embodiments. For example, in another embodiment, the invention provides a business method that performs the process steps of the invention on a subscription, advertising, and/or fee basis. That is, a service provider, such as an Application Service Provider, could offer to determine ion beam parallelism and direction integrity, as described above. In this case, the service provider can create, maintain, and support, etc., a computer infrastructure, such as a controller 24 (FIG. 5) that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for determining ion beam parallelism and direction integrity. In this case, a computer infrastructure, such as controller 24 (FIG. 5), can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computing device, such as controller 24 (FIG. 5), from a computer-readable medium; (2) adding one or more computing devices to the computer infrastructure; and (3) incorporating and/or modifying one or more existing systems of the computer infrastructure, to enable the computer infrastructure to perform the process steps of the invention.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for determining parallelism of an ion beam in an ion implanter system for implanting into a work piece, the method comprising the steps of:
   determining a first test position of the ion beam while not exposing the ion beam to an acceleration/deceleration electrical field;
   determining a second test position of the ion beam while exposing the ion beam to the acceleration/deceleration electrical field; and
   determining the parallelism of the ion beam based on the first test position and the second test position.

2. The method of claim 1, wherein the first and second test position determining steps each include obtaining a profile and a position of the ion beam within an acceleration/deceleration column of the ion implanter system.

3. The method of claim 2, wherein the obtaining steps include using a traveling Faraday cup system.

4. The method of claim 1, wherein the parallelism determining step includes:
   determining a lateral shift between the first test position and the second test position; and
   determining the parallelism of the ion beam based on the lateral shift.

5. The method of claim 1, further comprising the step of adjusting the ion implanter system based on a result of the parallelism determining step.

6. The method of claim 5, wherein the adjusting step includes adjusting at least one of the following: an angle of the work piece and an optical component of the ion implanter system.

7. The method of claim 1, wherein the first and second test position determining steps are repeated for a plurality of scanning positions of the ion beam, and the parallelism determining step includes determining the parallelism based on each of the first and second test positions.

8. A system for determining a parallelism of an ion beam in an ion implanter system for implanting into a work piece, the method comprising the steps of:
   a position determinator for determining a first test position of the ion beam while not exposing the ion beam to an acceleration/deceleration electrical field and a second test position of the ion beam while exposing the ion beam to the acceleration/deceleration electrical field; and
   a parallelism determinator for determining the parallelism of the ion beam based on the first test position and the second test position.

9. The system of claim 8, wherein the position determinator communicates with an ion beam profiler that obtains a profile of the ion beam within an acceleration/deceleration column of the ion implanter system.

10. The system of claim 8, wherein the parallelism determinator includes:
    a lateral shift determinator for determining a lateral shift between the first test position and the second test position; and
    a parallelism calculator for calculating the parallelism of the ion beam based on the lateral shift.

11. The system of claim 8, further comprising an adjuster for adjusting the ion implanter system based on a result of the parallelism determinator.

12. The system of claim 11, wherein the adjuster adjusts at least one of the following: an angle of the work piece and an optical component of the ion implanter system.

13. The system of claim 8, wherein the position determinator determines the first and second test position for a plurality of scanning positions of the ion beam, and the parallelism determinator determines the parallelism based on each of the first and second test positions.

14. A computer program product for determining a parallelism of an ion beam in an ion implanter system for implanting into a work piece, the computer program product comprising:
    a computer usable medium having computer usable program code embodied therein, the computer usable medium including:

program code configured to determine a first test position of the ion beam while not exposing the ion beam to an acceleration/deceleration electrical field;

program code configured to determine a second test position of the ion beam while exposing the ion beam to the acceleration/deceleration electrical field; and program code configured to determine the parallelism of the ion beam based on the first test position and the second test position.

15. The program product of claim 14, wherein the first and second test position determining codes each use a profile of the ion beam after an acceleration/deceleration column of the ion implanter system.

16. The program product of claim 14, wherein the parallelism determining code includes:

program code configured to determine a lateral shift between the first test position and the second test position; and program code configured to determine the parallelism of the ion beam based on the lateral shift.

17. The program product of claim 14, further comprising program code configured to adjust the ion implanter system based on a result of the parallelism determining code.

18. The program product of claim 17, wherein the adjusting code includes program code for adjusting at least one of the following: an angle of the work piece and an optical component of the ion implanter system.

19. The program product of claim 14, wherein the first and second test position determining codes repeat the first and second test position determining for a plurality of scanning positions of the ion beam, and the parallelism determining code includes program code configured to determine the parallelism based on each of the first and second test positions.

20. An ion implanter system for implanting an ion beam into a work piece, the ion implanter system comprising:

an ion beam generator; and a system for determining a parallelism of the ion beam in the ion implanter system including:

a position determinator for determining a first test position of the ion beam while not exposing the ion beam to an acceleration/deceleration electrical field and determining a second test position of the ion beam while exposing the ion beam to the acceleration/deceleration electrical field; and a parallelism determinator for determining the parallelism of the ion beam based on the first test position and the second test position.

21. The ion implanter system of claim 20, wherein the position determinator communicates with an ion beam profiler that obtains a profile of the ion beam after an acceleration/deceleration column of the ion implanter system.

22. The ion implanter system of claim 20, wherein the parallelism determinator includes:

a lateral shift determinator for determining a lateral shift between the first test position and the second test position; and a parallelism calculator for calculating the parallelism of the ion beam based on the lateral shift.

23. The ion implanter system of claim 20, further comprising an adjuster for adjusting the ion implanter based on the parallelism, wherein the adjuster adjusts at least one of the following: an angle of the work piece and an optical component of the ion implanter system.

24. The ion implanter system of claim 20, wherein the position determinator determines the first and second test positions for a plurality of scanning positions of the ion beam, and the parallelism determinator determines the parallelism based on each of the first and second test positions.

* * * * *